US012626766B2

(12) United States Patent
Xiang et al.

(10) Patent No.: US 12,626,766 B2
(45) Date of Patent: May 12, 2026

(54) METHOD AND APPARATUS FOR GIDL ERASE IN MEMORY SYSTEMS

(71) Applicant: Yangtze Memory Technologies Co., Ltd., Wuhan (CN)

(72) Inventors: Li Xiang, Wuhan (CN); Zhuo Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 167 days.

(21) Appl. No.: 18/518,410

(22) Filed: Nov. 22, 2023

(65) Prior Publication Data

US 2025/0118373 A1 Apr. 10, 2025

Related U.S. Application Data

(63) Continuation of application No. PCT/CN2023/123724, filed on Oct. 10, 2023.

(51) Int. Cl.
*G11C 16/14* (2006.01)
*G11C 16/04* (2006.01)
*G11C 16/08* (2006.01)
*G11C 16/32* (2006.01)

(52) U.S. Cl.
CPC .......... *G11C 16/14* (2013.01); *G11C 16/0433* (2013.01); *G11C 16/08* (2013.01); *G11C 16/32* (2013.01)

(58) Field of Classification Search
CPC ..... G11C 16/14; G11C 16/4033; G11C 16/08; G11C 16/32
USPC .................................................... 365/185.29
See application file for complete search history.

(56) References Cited

U.S. PATENT DOCUMENTS

| | | | |
|---|---|---|---|
| 2013/0314995 A1* | 11/2013 | Dutta | G11C 11/5635 365/185.17 |
| 2014/0226416 A1* | 8/2014 | Li | G11C 16/0483 365/185.26 |
| 2019/0252029 A1 | 8/2019 | Lai et al. | |
| 2019/0279720 A1 | 9/2019 | Nam et al. | |
| 2023/0253050 A1 | 8/2023 | Kim et al. | |

FOREIGN PATENT DOCUMENTS

| | | |
|---|---|---|
| EP | 2304734 | 7/2017 |

OTHER PUBLICATIONS

International Search Report in International Appln. No. PCT/CN2023/123724, mailed on Apr. 5, 2024, 3 pages.

* cited by examiner

*Primary Examiner* — Anthan Tran
*Assistant Examiner* — Duy H Luong
(74) *Attorney, Agent, or Firm* — Fish & Richardson P.C.

(57) ABSTRACT

The present disclosure relates to methods and devices for memory erase. In one example, a method for operating a memory device includes increasing a voltage of a source line (SL) coupled to a memory string from an initial voltage at a beginning of a time period, where the voltage of the SL is increased to an erase voltage at an end of the time period. The memory device can apply a first voltage to a first word line (WL) before the end of the time period. The memory device can apply a second voltage to a second WL adjacent to the first WL before the end of the time period. The memory device can further apply a third voltage to the second WL no later than the end of the time period, where the third voltage is higher than the second voltage.

20 Claims, 10 Drawing Sheets

800

802 — INCREASE A VOLTAGE OF A SOURCE LINE (SL) COUPLED TO A MEMORY STRING FROM AN INITIAL VOLTAGE AT A BEGINNING OF A TIME PERIOD, WHEREIN THE VOLTAGE OF THE SL IS INCREASED TO AN ERASE VOLTAGE AT AN END OF THE TIME PERIOD

804 — APPLY A FIRST VOLTAGE TO A FIRST WORD LINE (WL) BEFORE THE END OF THE TIME PERIOD

806 — APPLY A SECOND VOLTAGE TO A SECOND WL ADJACENT TO THE FIRST WL BEFORE THE END OF THE TIME PERIOD

808 — APPLY A THIRD VOLTAGE TO THE SECOND WL NO LATER THAN THE END OF THE TIME PERIOD, WHEREIN THE THIRD VOLTAGE IS HIGHER THAN THE SECOND VOLTAGE

800

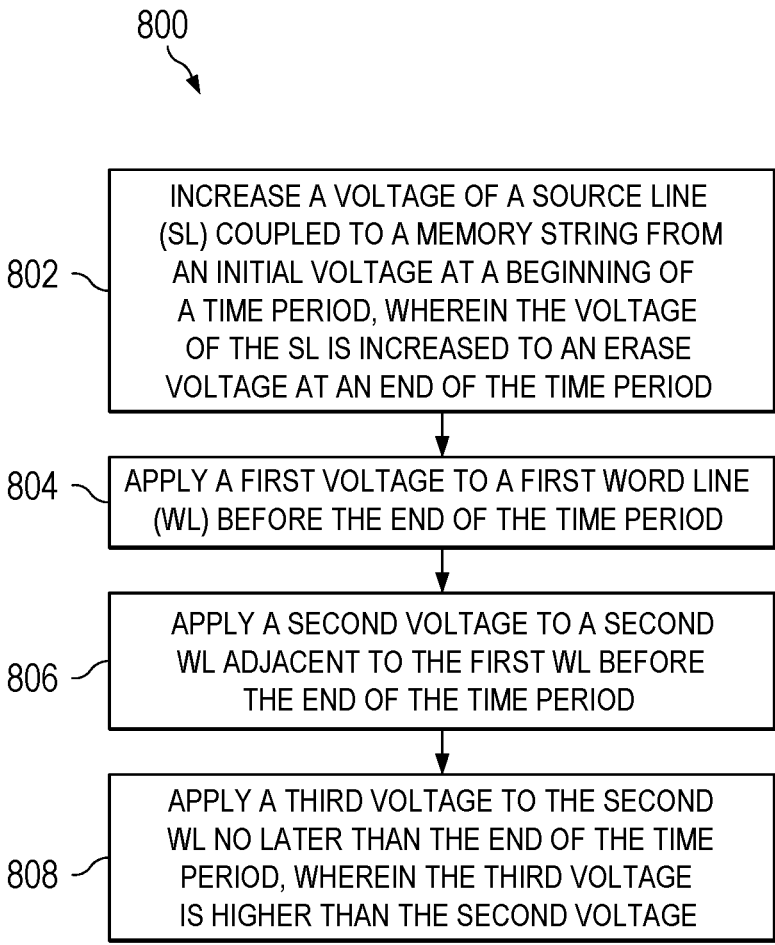

802 — INCREASE A VOLTAGE OF A SOURCE LINE (SL) COUPLED TO A MEMORY STRING FROM AN INITIAL VOLTAGE AT A BEGINNING OF A TIME PERIOD, WHEREIN THE VOLTAGE OF THE SL IS INCREASED TO AN ERASE VOLTAGE AT AN END OF THE TIME PERIOD

804 — APPLY A FIRST VOLTAGE TO A FIRST WORD LINE (WL) BEFORE THE END OF THE TIME PERIOD

806 — APPLY A SECOND VOLTAGE TO A SECOND WL ADJACENT TO THE FIRST WL BEFORE THE END OF THE TIME PERIOD

808 — APPLY A THIRD VOLTAGE TO THE SECOND WL NO LATER THAN THE END OF THE TIME PERIOD, WHEREIN THE THIRD VOLTAGE IS HIGHER THAN THE SECOND VOLTAGE

FIG. 8

METHOD AND APPARATUS FOR GIDL ERASE IN MEMORY SYSTEMS

CROSS-REFERENCE TO RELATED APPLICATIONS

This application is a continuation of International Application No. PCT/CN2023/123724, filed on Oct. 10, 2023, the disclosure of which is hereby incorporated by reference in its entirety.

TECHNICAL FIELD

The present disclosure generally relates to memory devices and memory systems, and in particular, to memory cell erase operations.

BACKGROUND

Semiconductor memory devices can be categorized into volatile memory devices and non-volatile memory devices. The volatile memory devices lost data when power is off. The non-volatile memory devices can retain stored data when power is not connected. Flash memory is a low-cost and high-density non-volatile memory device, which includes NOR flash memory and NAND flash memory. Various operations, such as read, program (write), and erase, can be performed by the flash memory.

SUMMARY

The present disclosure relates to methods and devices for memory erase. In one example, a method for operating a memory device includes increasing a voltage of a source line (SL) coupled to a memory string from an initial voltage at a beginning of a time period, where the voltage of the SL is increased to an erase voltage at an end of the time period. The memory device can apply a first voltage to a first word line (WL) before the end of the time period. The memory device can apply a second voltage to a second WL adjacent to the first WL before the end of the time period. The memory device can further apply a third voltage to the second WL no later than the end of the time period, where the third voltage is higher than the second voltage.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 8 illustrates an example flowchart of a method for performing a GIDL erase operation, according to some aspects of the present disclosure.

Like reference numbers and designations in the various drawings indicate like elements.

DETAILED DESCRIPTION

Gate induced drain leakage (GIDL) effect can be used in an erase operation of flash memory cells (e.g., NAND memory cells). GIDL occurs when a high voltage is applied to a drain of a metal-oxide-semiconductor field-effect transistor (MOSFET) transistor and a low voltage is applied to a gate of the transistor. In this situation, a depletion region is formed in an overlap region of the drain and the gate. Electron-hole pairs can be generated in the depletion region due to band-to-band tunneling. As a result, holes may flow from the drain to a substrate of the transistor, which creates a GIDL current. The GIDL current increases when increasing a voltage difference between the drain and the gate. In a GIDL erase operation of a flash memory device, a transistor (e.g., a bottom select gate (BSG)) of a memory string can serve as a GIDL generator. Specifically, a low voltage can be applied to a gate of the BSG, and a high voltage can be applied to a source line (SL) coupled to the BSG. A GIDL current can then be generated from the BSG, and holes can be injected into a channel of the memory string to raise a voltage of the channel up to an erase voltage. Thus, memory cells in the memory string will be erased when an appropriate voltage is applied to gates of the memory cells. The voltage of the channel will reach the erase voltage faster when the GIDL current is larger. In other words, the performance of GIDL erase operations may depend on the efficiency of the GIDL effect. Therefore, techniques to improve the efficiency of the GIDL effect in memory devices are desired.

Figure 1:
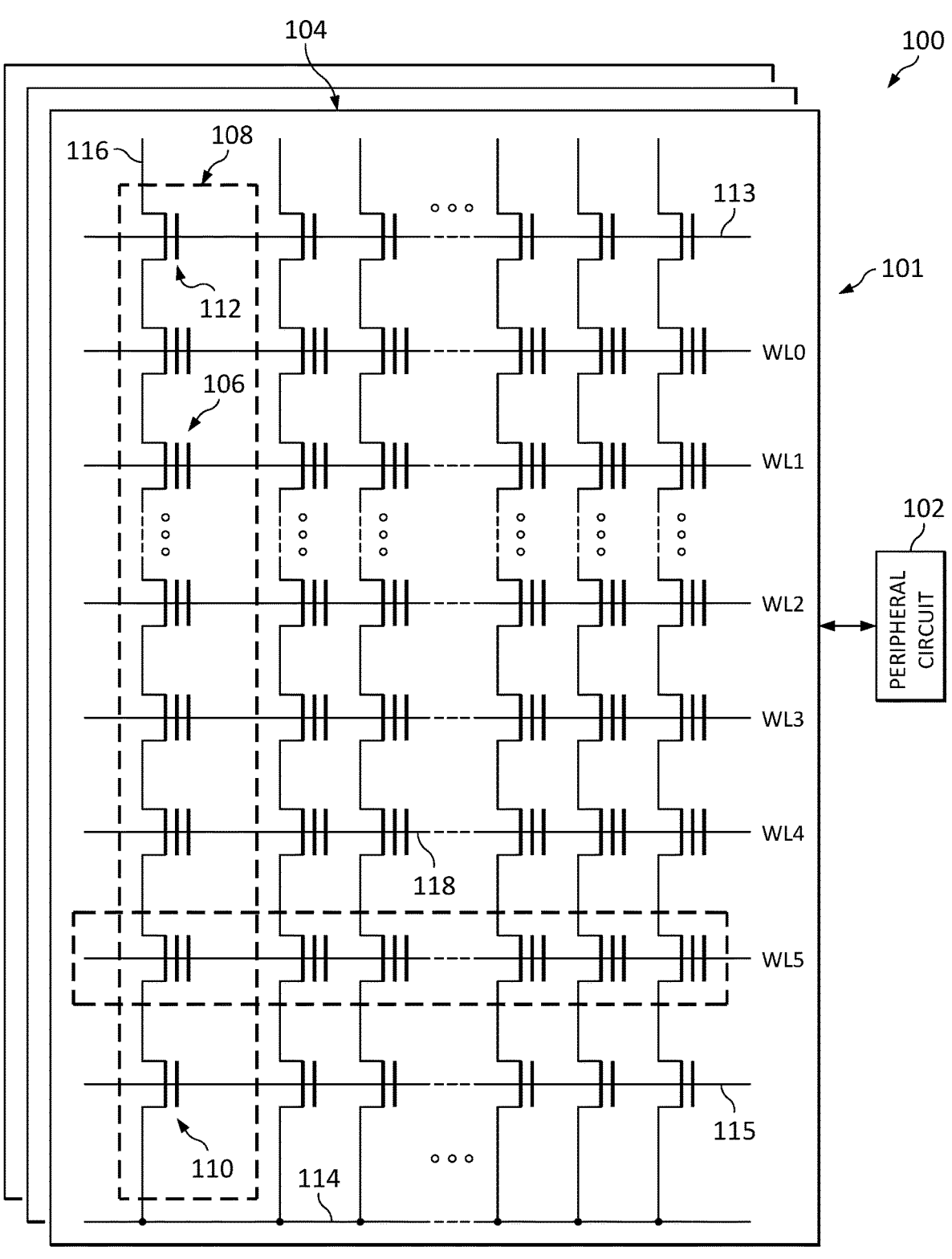
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND flash memory cell array in which memory cells 106 are provided in the form of an array of memory strings 108 (e.g., NAND memory strings) each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 can be referred to as a bottom select gate (BSG), and DSG 112 can be referred to as a top select gate (TSG). BSG 110 and TSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, NAND memory strings 108 in the same block 104 have an array common source (ACS), according to some implementations. TSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage (e.g., above the threshold voltage of the transistor having TSG 112) or a deselect voltage (e.g., 0 V) to respective TSG 112 through one or more TSG lines 113, and/or by applying a select voltage (e.g., above the threshold voltage of the transistor having BSG 110) or a deselect voltage (e.g., 0 V) to respective BSG 110 through one or more BSG lines 115. In some implementations, NAND memory string 108 includes the bottom memory cell abutted BSG 110 and the top memory cell abutted TSG 112, where the bottom memory cell is coupled to the bottom word line, for example, WL5 shown in FIG. 1, and the top memory cell is coupled to the top word line, for example, WL0 shown in FIG. 1.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Verase), such as a high positive voltage (e.g., 20V or more). In some examples, erase operation may be performed at a half-block level, a quarter-block level, or a level having any suitable number of blocks or any suitable fractions of a block. Memory cells 106 of adjacent NAND memory strings 108 can be coupled through word lines 118 that select which row of memory cells 106 is affected by read and program operations. Example word lines shown in FIG. 1 include top word line WL0, WL1, WL2, WL3, WL4, and bottom word line WL5 that are between one or more TSG lines 113 and one or more BSG lines 115.

Figure 2:
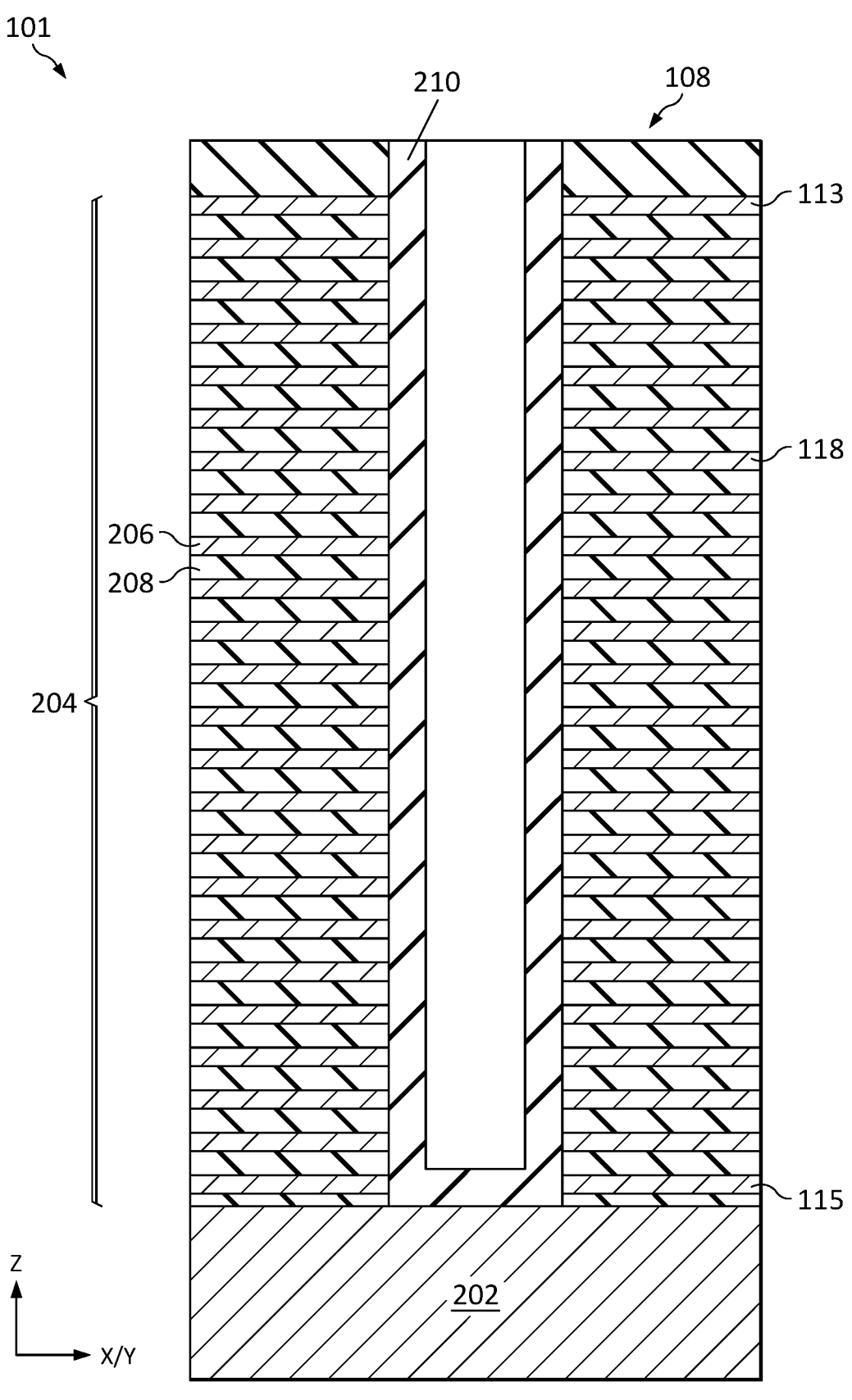
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, TSG 112, or BSG 110, and can extend laterally as TSG line 113 at the top of memory stack 204, BSG line 115 at the bottom of memory stack 204, or word line 118 between TSG line 113 and BSG line 115.

As shown in FIG. 2, NAND memory string 108 includes a channel 210 extending vertically through memory stack 204. In some implementations, channel 210 includes multiple layers each formed of a different material (e.g., a semiconductor material or a dielectric material).

Figure 3:
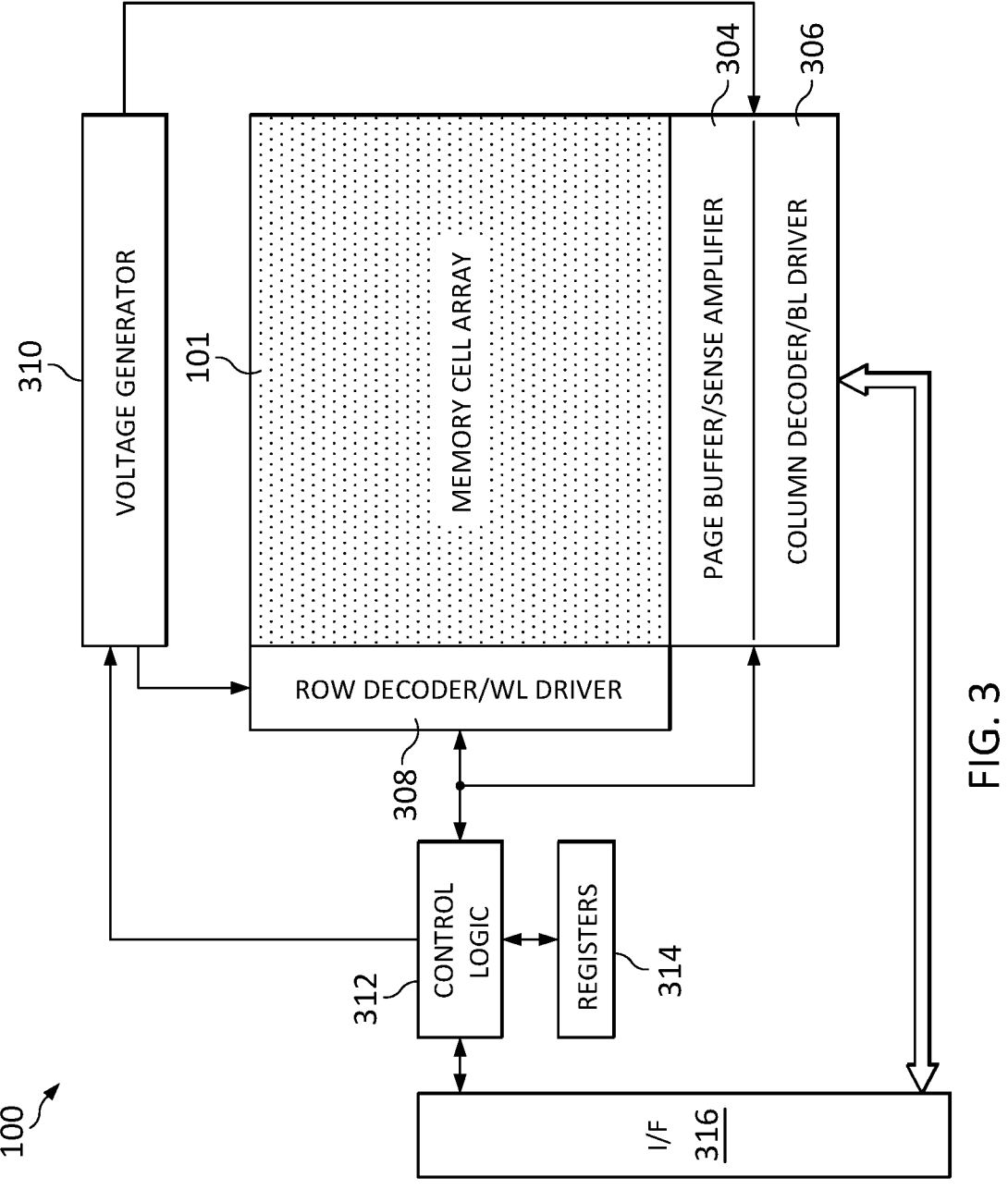
FIG. 3 illustrates an example of a schematic diagram of some peripheral circuits, according to some aspects of the present disclosure.

FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well. Peripheral circuits 102 can be coupled to memory cell array 101 through bit lines 116, word lines 118, source lines 114, BSG lines 115, and TSG lines 113 of FIG. 1. Peripheral circuits 102 can include any suitable analog, digital, and mixed-signal circuits for facilitating the operations of memory cell array 101 by applying and sensing voltage signals and/or current signals to and from each target memory cell 106 through bit lines 116, word lines 118, source lines 114, BSG lines 115, and TSG lines 113. Peripheral circuits 102 can include various types of peripheral circuits formed using metal-oxide-semiconductor (MOS) technologies.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive BSG lines 115 and TSG lines 113 as well. As described below in detail, row decoder/word line driver 308 is configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. As described below in detail, the status registers of registers 314 can include one or more registers configured to store open block information indicative of the open block(s) of all blocks 104 in memory cell array 101. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/bit line driver 306 via a data bus and act as a data input/output (I/O) interface and a data buffer to buffer and relay the data to and from memory cell array 101.

Figure 4:
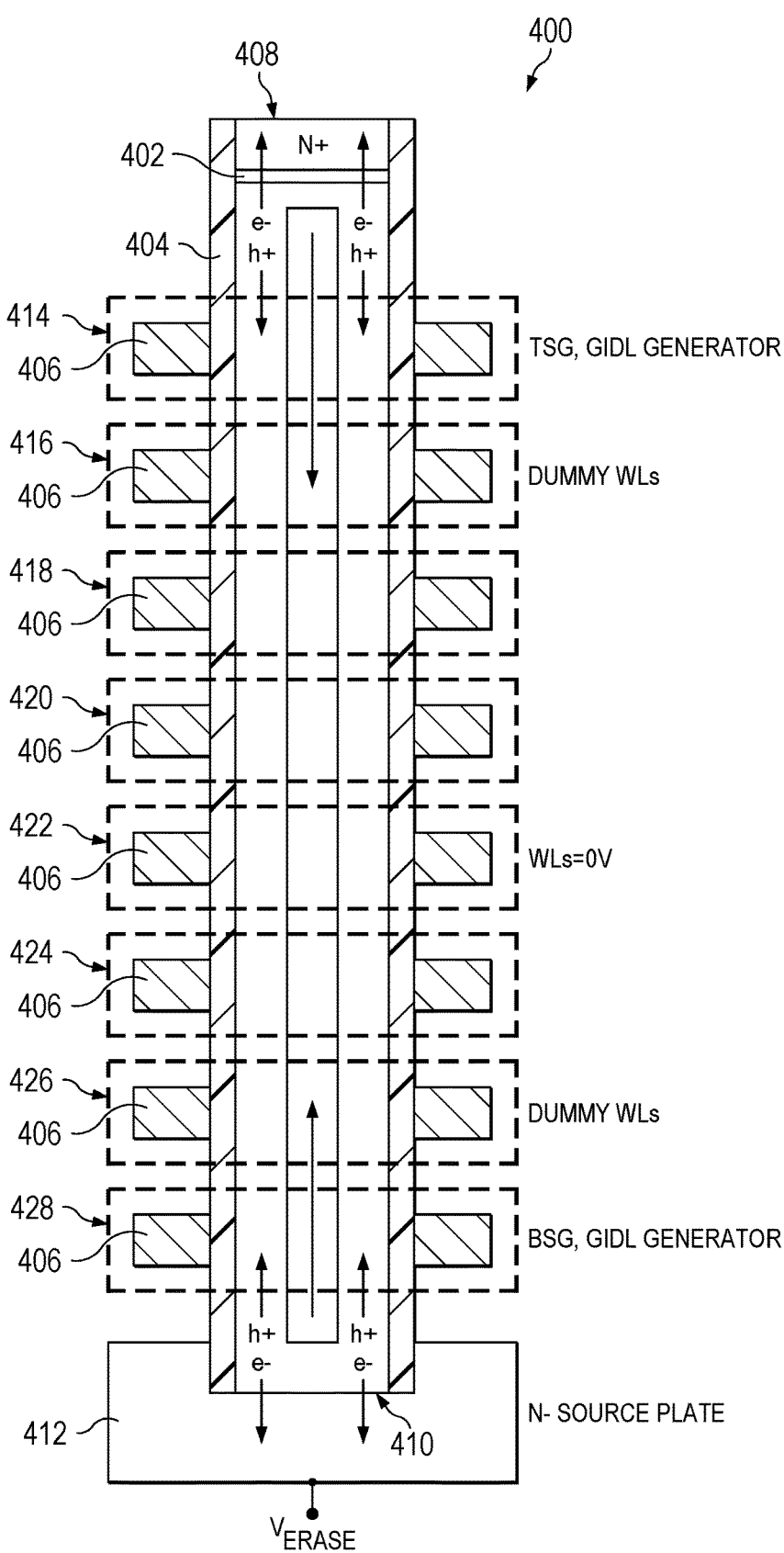
FIG. 4 illustrates an example of an example of gate induced drain leakage (GIDL) current generation in a memory string, according to some aspects of the present disclosure.

FIG. 4 illustrates an example of GIDL current generation in a memory string 400, according to some aspects of the present disclosure. Memory string 400 can be an example of NAND memory string 108 in FIG. 1. FIG. 4 illustrates a cross-section of memory string 400. As shown in FIG. 4, memory string 400 includes a channel 402, a memory film 404, and word lines 406. Channel 402 has two ends 408 and 410. End 408 is connected to a bit line (not shown in FIG. 4), and end 410 is connected to a source 412. Source 412 is connected to a source line (e.g., source line 114 in FIG. 1). Memory string 400 includes transistors and memory cells 414-428 formed by channel 402, memory film 404, and word lines 406. Transistors and memory cells 414-428 are coupled in series and stacked vertically. Transistor 414 is a TSG (e.g., TSG 112 in FIG. 1), and transistor 428 is a BSG (e.g., BSG 110 in FIG. 1). Memory cells 416-426 can be NAND memory cells. In some implementations, memory cells (e.g., 416 and 426) located adjacent to select gate transistors (e.g., TSG 414 and BSG 428) are not used for data storage. Rather, they serve as dummy memory cells to reduce interferences between memory cells that store data and select gate transistors (e.g., TSG 414 and BSG 428). Word lines coupled to the dummy memory cells can be referred to as dummy word lines.

A GIDL erase operation may require at least one transistor from memory string 400 to generate a GIDL current. This transistor may be referred to as a GIDL generator or a GIDL transistor. In one implementation, either TSG 414 or BSG 428 can be the GIDL transistor. For example, a low voltage can be applied to a gate of BSG 428, and a high voltage can be applied to source 412. A GIDL current can be generated from BSG 428, and holes can be injected into channel 402. A voltage of channel 402 will be raised up to an erase voltage. Thus, memory cells 418-424 will be erased when an appropriate volage (e.g., 0V) is applied to their gates. Similarly, when applying a high voltage to the bit line coupled to end 408 and a low voltage to a gate of TSG 414, TSG 414 can serve as a GIDL transistor to generate a GIDL current that flows into channel 402 from the top side. In another implementation, both TSG 414 and BSG 428 can be GIDL transistors, which is referred to as a dual-side GIDL injection. In some other implementations, a dummy cell (e.g., dummy cell 416 or 426) of memory string 400 can also be a GIDL transistor during a GIDL erase operation.

Figure 5:
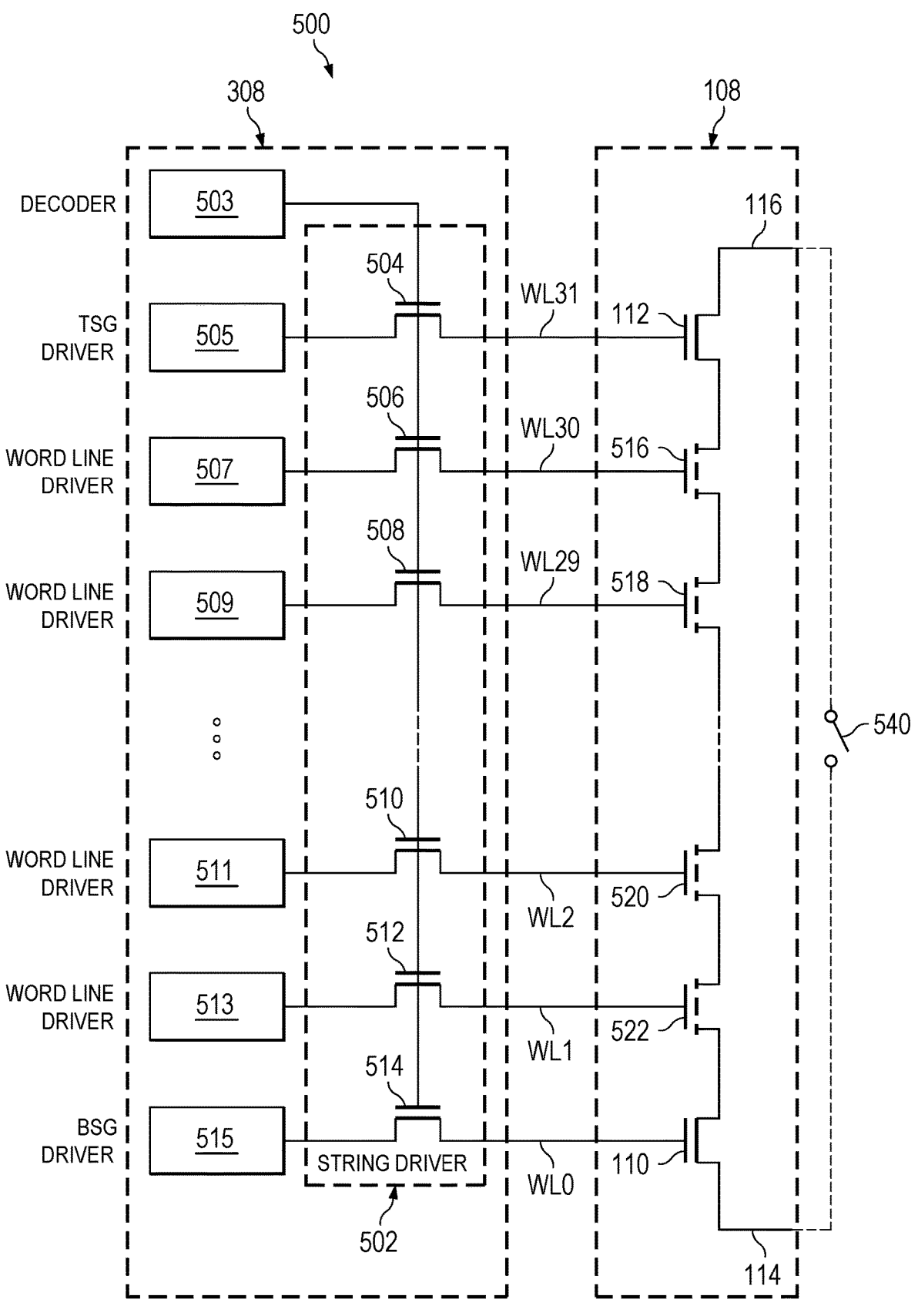
FIG. 5 illustrates an example circuit for performing GIDL erase operations, according to some aspects of the present disclosure.

FIG. 5 illustrates an example circuit 500 for performing GIDL erase operations, according to some aspects of the present disclosure. Circuit 500 in FIG. 5 can be part of memory device 100 in FIG. 1. Circuit 500 includes row decoder/word line driver 308 and is coupled to at least one memory string 108 (e.g., a NAND memory string). Circuit 500 can be part of a peripheral circuit of a memory device (e.g., peripheral circuit 102 of FIG. 1 or the peripheral circuits shown in FIG. 3). In some implementations, circuit 500 further includes a voltage generator (e.g., voltage generator 310 of FIG. 3, which is not shown in FIG. 5) Memory string 108 includes TSG 112, memory cells 516-524, and BSG 110 coupled in series. TSG 112 is coupled to bit line 116, and BSG 110 is coupled to source line 114. The transistors and memory cells in memory string 108 are coupled to row decoder/word line driver 308 through WL0-WL31 and are configured to receive control voltages from row decoder/word line driver 308. Row decoder/word line driver 308 includes a string driver 502, decoder 503, and drivers 505-515. Decoder 503 is configured to select and control transistors of string driver 502 and is coupled to a voltage generator (e.g., voltage generator 310 of FIG. 3). Driver 505 can be called TSG driver, which is configured to provide a control voltage to TSG 112. Driver 515 can be called BSG driver, which is configured to provide a control voltage to BSG 110. Drivers 507-513 are word line drivers, which are configured to provide control voltages to WL1-WL30. In some implementations, word line drivers 507-513 are coupled between a voltage generator (e.g., voltage generator 310 of FIG. 3) and WL1-WL30 and are configured to provide voltages from the voltage generator to WL1-WL30. String driver 502 includes driving transistors 504-514 coupled in parallel through their gates. Controlled by a voltage from decoder 503, each of driving transistors 504-514 is configured to pass a voltage from one of the drivers 505-515 to a corresponding transistor in memory string 108.

Circuit 500 can be configured to perform a GIDL erase operation by using either TSG 112 (applying a high voltage to bit line 116) or BSG 110 (applying a high voltage to source line 114) as a GIDL transistor. Optionally, as shown in FIG. 5, bit line 116 and source line 114 can be connected through a switch 540. When switch 540 is closed (turned on), a high voltage can be applied to both bit line 116 and source line 114. In this situation, memory string 108 can have two GIDL transistors (TSG 414 and BSG 428) and can inject GIDL currents into a channel of memory string 108 from both ends at the same time. This is the dual-side GIDL injection discussed in FIG. 4.

Figure 6:
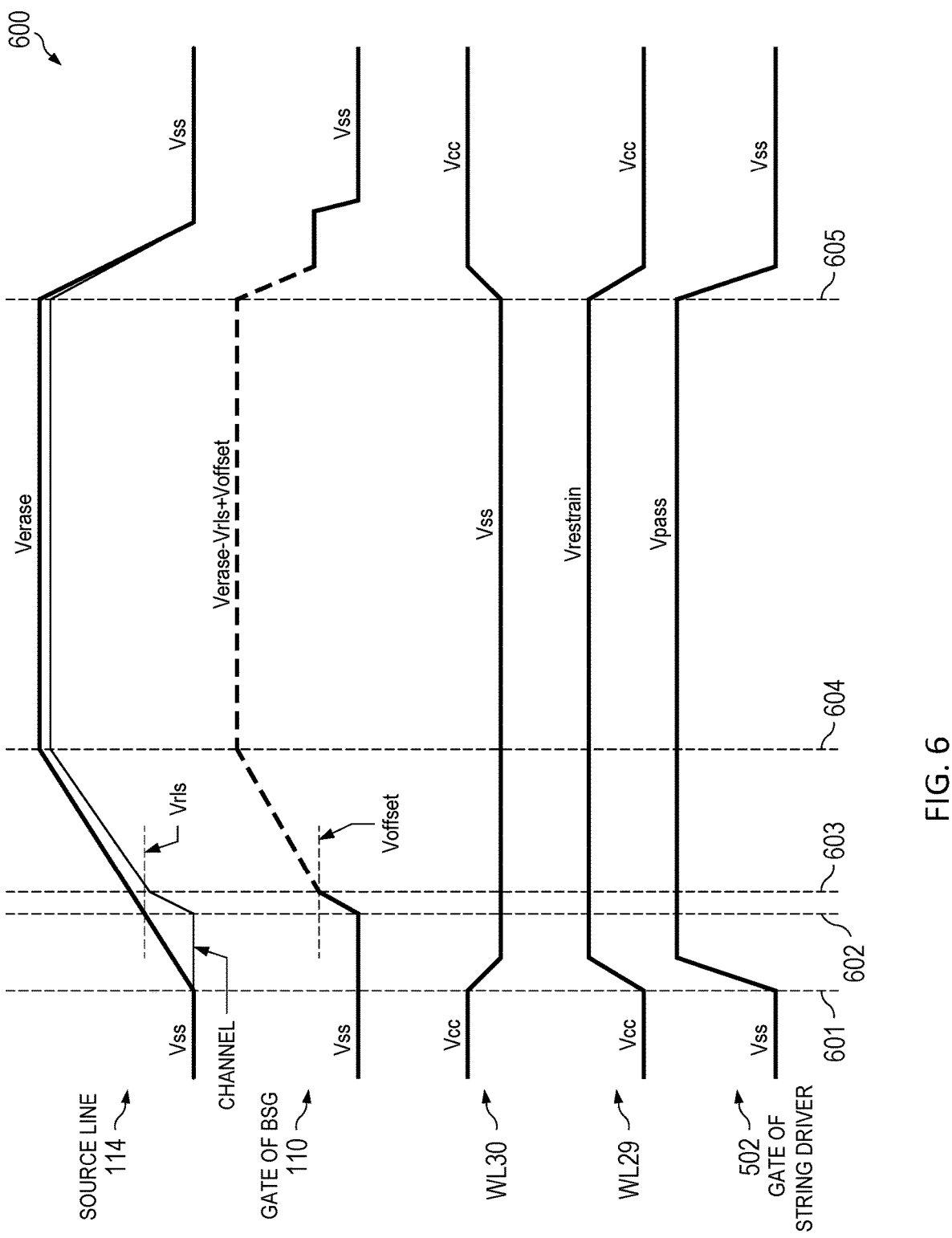
FIG. 6 illustrates an example timing diagram of a GIDL erase operation, according to some aspects of the present disclosure.

FIG. 6 illustrates a timing diagram 600 of an example GIDL erase operation, according to some aspects of the present disclosure. The GIDL erase operation illustrated in FIG. 6 can be performed by any suitable device disclosed herein including circuit 500 of FIG. 5. In this example, BSG 110 can act as a GIDL transistor. To generate a GIDL current, a voltage difference between a gate of BSG 110 (i.e., WL0) and source line 114, which can be referred to as a delta voltage, has to be sufficiently high (e.g., larger than 6V). Thus, an operation to erase memory cell 516 may start at time 601 by raising up a voltage at source line 114. It should be appreciated that this example erase operation is not intended to be construed in a limiting sense. In some implementations, an erase operation may be performed at a block level, a half-block level, a quarter-block level, or any suitable fraction of a memory block by applying voltages to a set of selected word lines. When the voltage at source line 114 starts to increase, the voltage at the gate of BSG 110 is maintained at a lower level, e.g., at a source supply voltage (Vss). In some implementations, Vss can be 0V. The voltage at the gate of BSG 110 is provided by BSG driver 515 through driving transistor 514 of string driver 502. At time 601, a low voltage (e.g., Vss) which is provided by word line driver 507 through driving transistor 506 of string driver 502, can be applied to WL30 (i.e., a gate of memory cell 516). Thus, the voltage at WL30 (first word line) can be changed from a common collector voltage Vcc to Vss. In some implementations, Vss can also be applied to WL30 prior to time 601. At time 601, a string driver gate voltage, which is applied to the gates of the driving transistors, is changed from an initial value (e.g., Vss) to a pass voltage Vpass. The pass voltage Vpass turns on the driving transistors of string driver 502 so that the voltages from word line driver 507 and BSG driver 515 can be passed to WL30 and WL0. The string driver gate voltage can be provided by decoder 503. In some implementations, Vpass can be around 10V.

Since the voltage at the gate of BSG 110 is kept at Vss, the delta voltage increases as the voltage at source line 114 increases. A larger delta voltage can improve the GIDL efficiency. But constantly keeping the voltage at the source of BSG 110 higher than the voltage at the gate of BSG 110 may cause weak-erase of BSG 110 (i.e., threshold voltage shifting) over time. To prevent the memory cell erase operation from affecting the functionality of BSG 110, the voltage at the gate of BSG 110 can be increased to a higher level once the delta voltage is high enough to trigger the GIDL effect. In this example, when the voltage at source line 114 reaches a release voltage (Vrls) at time 602, the voltage from BSG driver 515 can be increased from Vss to the pass voltage Vpass. As a result, the voltages at both the drain and the gate of driving transistor 514 are at the same level (Vpass), which turns driving transistor 514 into a diode, blocking a current flowing from BSG driver 515 to BSG 110. This change will increase the voltage at the gate of BSG 110 from Vss to an offset voltage Voffset (e.g., 3V-5V) at time 603 and float BSG 110. Voffset is determined by Vpass and a threshold voltage of driving transistor 514. For example, Voffset may equal Vpass subtracted by the threshold voltage of driving transistor 514. In some implementations, the difference between Vrls and Voffset (Vrls−Voffset) is between 6V-8V. When the voltage at source line 114 reaches Vrls at time 602, the voltage at the channel of memory string 108 starts to increase due to the GIDL effect. After BSG 110 is floated at 603, the voltage at the gate of BSG 110 increases as the voltage at the channel increases because BSG 110 is now coupled to the channel.

At time 604, the voltage at source line 114 reaches a high erase voltage Verase (e.g., 20V), and the voltage at the channel is determined by the erase voltage Verase and a small bias voltage caused by a coupling capacitor between the channel and source line 114. By maintaining the voltage difference between the channel and the WL30 for a time period (e.g., between 604 and 605), memory cell 516 will be erased.

Source line 114 can be coupled to sources of other memory strings in a same memory block, and WL1-WL30 can be coupled to corresponding memory cells of the other memory strings. In a block erase mode, word line drivers 509-513 also provide Vss to WL1-WL29, so that memory cells (including memory cells 518-522) in the entire memory block are erased in this erase operation. In this case, the delta voltage of the GIDL effect is determined by the voltage at source line 114 at time 603 (when BSG 110 is floated) subtracted by the voltage at the gate of BSG 110 at time 603 (Voffset). Voffset can be decreased by decreasing the pass voltage Vpass. In a block erase mode, the GIDL erase operation can use a lower Vpass, which can increase the delta voltage and thus improve the efficiency of the erase operation.

In a partial erase mode, there can be more restrictions on a lower bound of the pass voltage Vpass. The erase operation may be performed at a half-block level, a quarter-block level, or any suitable fractions of the memory block by only applying Vss to a subset of word lines selected from WL1-WL30 of memory string 108. For example, in an Odd/Even erase mode, memory cells (e.g., memory cells 516 and 520 in FIG. 5) coupled to word lines with even indices can be erased in an erase operation, and memory cells (e.g., memory cells 518 and 524 in FIG. 5) coupled to word lines with odd indices are not erased in the same erase operation. In this situation, when Vss is applied to WL30 to erase memory cell 516, a higher voltage can be applied to WL29 to prevent memory cell 518 from being erased. WL30 and WL29 can be associated with two consecutive index numbers (e.g., consecutive natural numbers). Thus, one of WL30 and WL29 has an even index number, and another of them has an odd index number. Floating memory cell 518 may raise the voltage at WL29 to a high level. However, if a floating voltage at WL29 is too high, it may reduce the erasing efficiency of memory cell 516 because WL29 can be coupled to WL30. Therefore, a better way to prevent memory cell 518 from being erased is to restrain the voltage at WL29 at a controllable level (e.g., Vrestrain), which can be provided by word line driver 509. For example, Vrestrain can be 7V-8V. To provide the restrain voltage Vrestrain from word line driver 509 to WL29, the pass voltage Vpass needs to be high enough to turn on driving transistor 508. Specifically, Vpass is higher than a sum of Vrestrain and a threshold voltage of driving transistor 508. In other words, in the partial erase mode, a lower bound of the pass voltage Vpass is limited by the restrain voltage Vrestrain. Thus, a higher restrain voltage may decrease the delta voltage and thus may reduce the efficiency of GIDL erase operations.

The present disclosure provides techniques for a memory device to ramp up a string driver gate voltage and a restrain voltage in two steps during a GIDL erase operation, which may improve the efficiency of the GIDL erase operation in a partial erase mode. The above aspects and some other aspects of the present disclosure are discussed in greater detail below.

Figure 7:
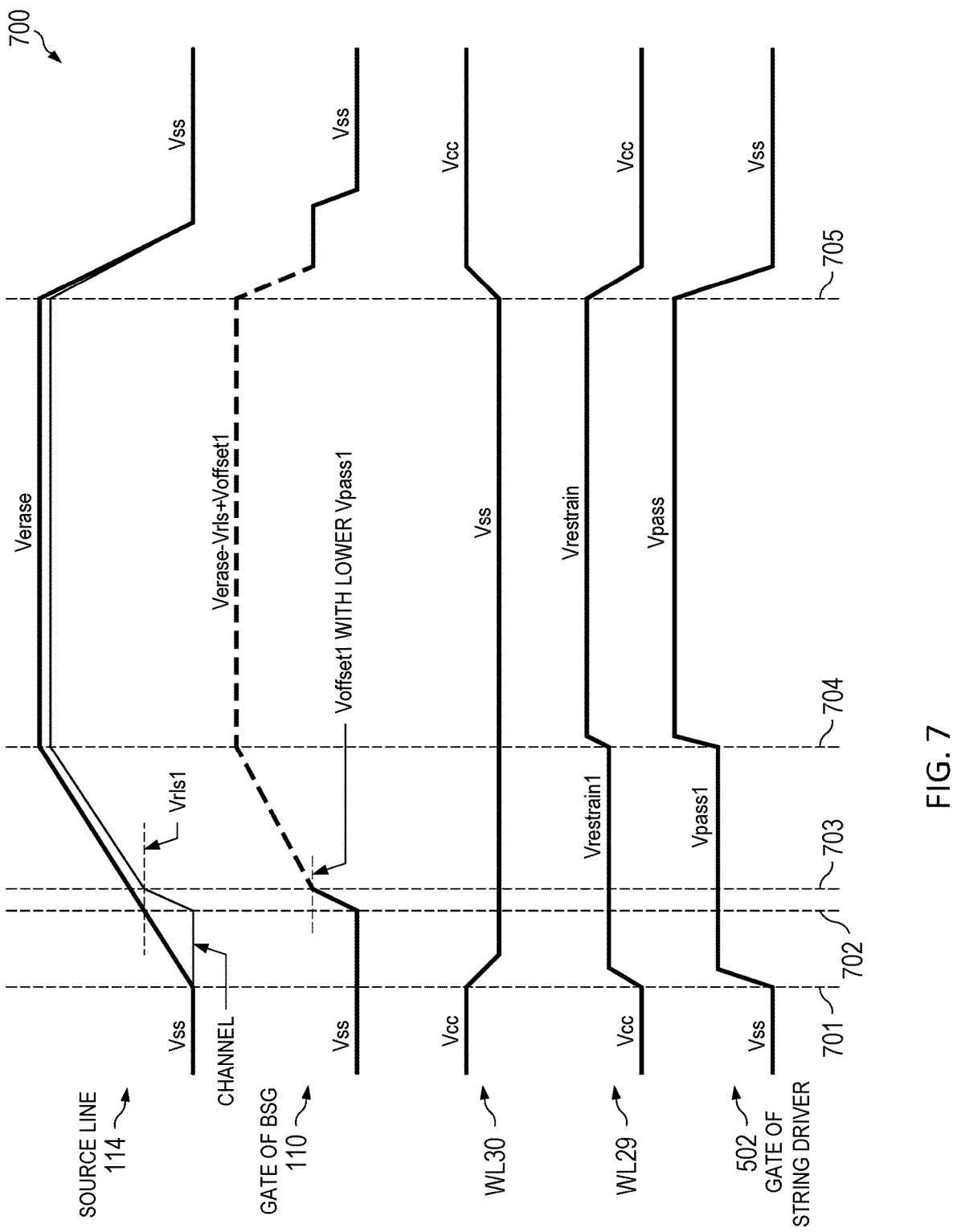
FIG. 7 illustrates an example timing diagram of another GIDL erase operation, according to some aspects of the present disclosure.

FIG. 7 illustrates a timing diagram 700 of another GIDL erase operation, according to some aspects of the present disclosure. The GIDL erase operation illustrated in FIG. 7 can be performed by any suitable device disclosed herein including circuit 500 of FIG. 5. In this example, BSG 110 serves as a GIDL transistor, and the GIDL erase operation is in a partial erase mode, where memory cell 516 is to be erased and memory cell 518 is not to be erased. The GIDL erase operation starts at time 701 by raising up a voltage at source line 114. When the voltage at source line 114 starts to increase, the voltage at the gate of BSG 110 is maintained at a lower level (e.g., Vss). BSG driver 515 can be configured to provide the voltage to the gate of BSG 110 through driving transistor 514 of string driver 502. At time 701, word line driver 507 can be configured to provide a low voltage (e.g., Vss) to WL30 (i.e., the gate of memory cell 516) through driving transistor 506 of string driver 502. At time 701, word line driver 509 can be configured to provide a first restrain voltage Vrestrain1 (e.g., 3V) to WL29 (i.e., the gate of memory cell 518) through driving transistor 508 of string driver 502. In some implementations, voltages Vss (first voltage) and Vrestrain1 (second voltage) can be respectively applied to WL30 (first word line) and WL29 (second word line) prior to time 701.

At time 701, the string driver gate voltage applied to the gates of the driving transistors of string driver 502 can increase from an initial value (e.g., Vss) to a first pass voltage Vpass1 (e.g., 5.6V) to turn on the driving transistors. As a result, the voltages from BSG driver 515, word line driver 507, and word line driver 509 are passed to the corresponding word lines.

At time 702, the voltage at source line 114 reaches a first release voltage (Vrls1, e.g., 4V-10V). In response to detecting that the voltage at source line 114 reaches Vrls1, the voltage from BSG driver 515 can be increased from Vss to the first pass voltage Vpass1. This change will increase the voltage at the gate of BSG 110 from Vss to a first offset voltage Voffset1 at time 703 and float BSG 110. Voffset1 is determined by Vpass1 and a threshold voltage of driving transistor 514. For example, Voffset1 may equal Vpass1 subtracted by the threshold voltage of driving transistor 514. When the voltage at source line 114 reaches Vrls1 at time 702, the voltage at the channel of memory string 108 starts to increase due to the GIDL effect. Starting from time 703, BSG 110 is floated and coupled to the channel, and thus the voltage at the gate of BSG 110 increases as the voltage at the channel increases.

At time 704, the voltage at source line 114 reaches a high erase voltage Verase (e.g., 20V), and the voltage at the channel is determined by the erase voltage Verase and a small bias voltage caused by a coupling capacitor between the channel and source line 114. In response to detecting that the voltage at source line 114 reaches Verase, the string driver gate voltage can increase from the first pass voltage Vpass1 to a pass voltage Vpass, and the voltage applied to WL29 can increase from the first restrain voltage Vrestrain1 to a restrain voltage Vrestrain (third voltage). By maintaining the voltage difference between the channel and the WL30 for a time period (e.g., between 704 and 705), memory cell 516 will be erased. On the other hand, memory cell 518 will not be erased because the voltage at WL29 is kept at a higher level (i.e., Vrestrain) during this time period.

In some implementations, the string driver gate voltage can increase from the first pass voltage Vpass1 to the pass voltage Vpass prior to time 704. As long as Vpass is equal to or less than a sum of a floating voltage of BSG 110 and a threshold voltage of driving transistor 514, BSG 110 will be kept at the floating state between time 703 and time 704. This way, the ramping up of the voltage at source line 114 between time 703 and time 704 will not be interrupted by the change of the string driver gate voltage.

As shown in FIG. 7, a two-step increase is applied to the string driver gate voltage and the voltage at WL29 during the voltage ramp up of source line 114, instead of directly increasing them to target voltages (as shown in FIG. 6). Thus, when BSG 110 is floated at time 703, the first offset voltage at the gate of BSG 110 can be lower (Voffset1<Voffset because Vpass1<Vpass). Therefore, the delta voltage for the GIDL erase operation illustrated by FIG. 7 is higher, which improves the efficiency of the erase operations.

In some implementations, only the string driver gate voltage is increased in two steps, while the voltage at WL29 can be increased to the restrain voltage directly. For example, at time 701, the string driver gate voltage is increased from Vss to Vpass1. At 704, the string driver gate voltage is increased from Vpass1 to Vpass. On the other hand, the voltage at WL29 can be increased from Vcc to Vrestrain directly at time 701 and is maintained at this level during the erase operation (not shown in FIG. 7).

Although a BSG of a memory string is used as a GIDL transistor in some examples provided in the present disclosure, these examples are not intended to be construed in a limiting sense. Any suitable GIDL transistors known in the art, such as a BSG, a TSG, a dummy memory cell, or a combination of any of the above, can serve as a GIDL transistor or GIDL transistors in GIDL erase operations described in the present disclosure.

FIG. 8 illustrates a flowchart of an example method 800 for performing a GIDL erase operation, in accordance with some aspects of the present disclosure. Method 800 can be performed by any suitable device disclosed herein including circuit 500 of FIG. 5. As shown in FIG. 8, operation 802 includes increasing a voltage of a source line coupled to a memory string from an initial voltage at a beginning of a time period. The voltage of the SL can be increased to an erase voltage at an end of the time period.

Operation 804 includes applying a first voltage to a first word line before the end of the time period.

Operation 806 includes applying a second voltage to a second WL adjacent to the first WL before the end of the time period.

Operation 808 includes applying a third voltage to the second WL no later than the end of the time period, wherein the third voltage is higher than the second voltage.

In some implementations, method 800 further includes in response to detecting that the voltage of the SL is increased to a release voltage during the time period, increasing a voltage of a gate of a first transistor comprised in the memory string to an offset voltage.

In some implementations, the first transistor can be a BSG of the memory string. The BSG is coupled to a first terminal of a first driving transistor of a string driver. The first WL is coupled to a first terminal of a second driving transistor of the string driver. The second WL is coupled to a first terminal of a third driving transistor of the string driver.

In some implementations, method 800 further includes applying a string driver gate voltage to a gate of the first driving transistor, a gate of the second driving transistor, and a gate of the third driving transistor. The string driver gate voltage can be increased from a supply voltage to a first string driver voltage before the end of the time period. The string driver gate voltage can be further increased from the first string driver voltage to a second string driver voltage no later than the end of the time period.

In some implementations, the memory string further comprises a TSG coupled to a bit line. The BL can be coupled to the SL through a switch, and the TSG can be coupled to a first terminal of a fourth driving transistor of the string driver. In those implementations, method 800 may further include providing a voltage to a second terminal of the fourth driving transistor and in response to detecting that a voltage of the BL is increased to a second release voltage, increasing the voltage of the second terminal of the fourth driving transistor.

Figure 9:
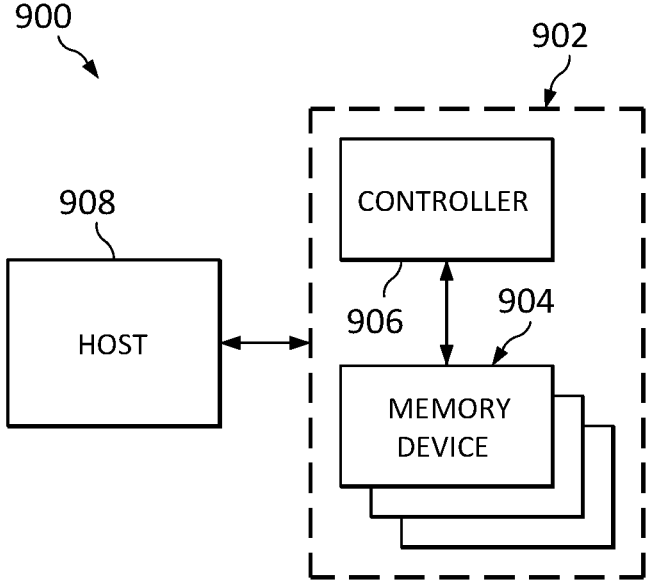
FIG. 9 illustrates a block diagram of an example system having a memory device, according to some aspects of the present disclosure.

FIG. 9 illustrates an example of a block diagram of system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, system 900 can include a host 908 and a memory system 902 having one or more memory devices 904 and a memory controller 906. Host 908 can be a processor of an electronic device, such as a central processing unit (CPU), or a system-on-chip (SoC), such as an application processor (AP). Host 908 can be configured to send or receive data to or from memory devices 904. In some implementations, a memory device in the one or more memory devices 904 can include circuit 500 in FIG. 5 for perform memory erase operations Memory device 904 can be any memory device disclosed in the present disclosure. Memory controller 906 is coupled to memory device 904 and host 908 and is configured to control memory device 904, according to some implementations. Memory controller 906 can manage the data stored in memory device 904 and communicate with host 908. In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 904, such as read, erase, and program operations. Memory controller 906 can also be configured to manage various functions with respect to the data stored or to be stored in memory device 904 including, but not limited to bad-block management, garbage collection, logical-to-physical address conversion, wear leveling, etc. In some implementations, memory controller 906 is further configured to process error correction codes (ECCs) with respect to the data read from or written to memory device 904. Any other suitable functions may be performed by memory controller 906 as well, for example, formatting memory device 904.

Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 10A:
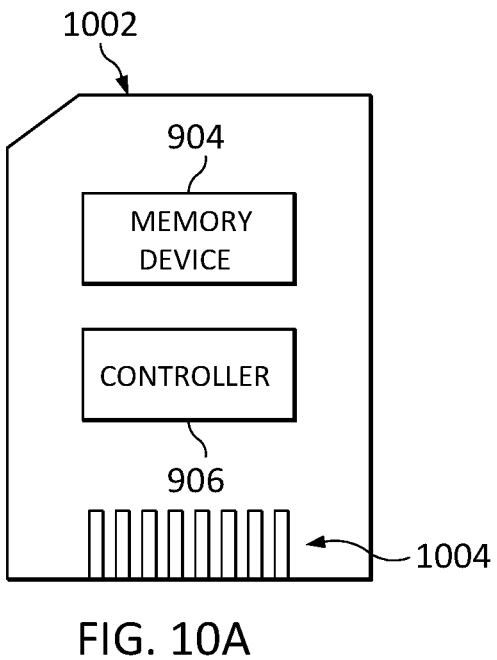
FIG. 10A illustrates a diagram of a memory card having a memory device, according to some aspects of the present disclosure.
Figure 10B:
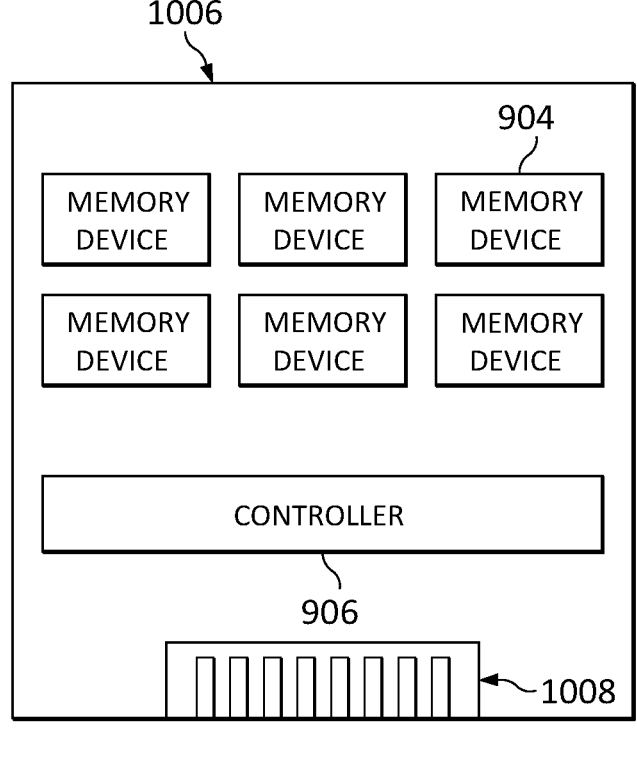
FIG. 10B illustrates a diagram of a solid-state drive (SSD) having a memory device, according to some aspects of the present disclosure.

Memory controller 906 and one or more memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 10A, memory controller 906 and a single memory device 904 may be integrated into a memory card 1002. Memory card 1002 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1002 can further include a memory card connector 1004 coupling memory card 1002 with a host (e.g., host 908 in FIG. 9). In another example as shown in FIG. 10B, memory controller 906 and multiple memory devices 904 may be integrated into an SSD 1006. SSD 1006 can further include an SSD connector 1008 coupling SSD 1006 with a host (e.g., host 908 in FIG. 9). In some implementations, the storage capacity and/or the operation speed of SSD 1006 is greater than those of memory card 1002.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

According to one aspect of the present disclosure, a method for operating a memory device is provided. The method includes increasing a voltage of a SL coupled to a memory string from an initial voltage at a beginning of a time period. The voltage of the SL is increased to an erase voltage at an end of the time period. The method further includes applying a first voltage to a first WL before the end of the time period. The method further includes applying a second voltage to a second WL adjacent to the first WL before the end of the time period. The method further includes applying a third voltage to the second WL no later than the end of the time period. The third voltage is higher than the second voltage.

In some implementations, the method further includes in response to detecting that the voltage of the SL is increased to a release voltage during the time period, increasing a voltage of a gate of a first transistor comprised in the memory string to an offset voltage.

In some implementations, the first transistor is a BSG of the memory string, the BSG is coupled to a first terminal of a first driving transistor of a string driver, the first WL is coupled to a first terminal of a second driving transistor of the string driver, and the second WL is coupled to a first terminal of a third driving transistor of the string driver. The method further includes applying a string driver gate voltage to a gate of the first driving transistor, a gate of the second driving transistor, and a gate of the third driving transistor. The method further includes increasing the string driver gate voltage from a supply voltage to a first string driver voltage before the end of the time period. The method further includes increasing the string driver gate voltage from the first string driver voltage to a second string driver voltage no later than the end of the time period.

In some implementations, the offset voltage is determined based on subtracting a threshold voltage of the first transistor from the first string driver voltage.

In some implementations, providing a first voltage to the first WL includes providing the first voltage to a second terminal of the second driving transistor, and providing a second voltage to the second WL includes providing the second voltage to a second terminal of the third driving transistor.

In some implementations, the second string driver voltage is less than a sum of a threshold voltage of the BSG driver and a floating voltage of the BSG.

In some implementations, after the first transistor is floated, the floating voltage of the BSG increases as the voltage of the SL increases.

In some implementations, the memory string further includes a TSG coupled to a BL, the BL is coupled to the SL through a switch, and the TSG is coupled to a first terminal of a fourth driving transistor of the string driver. The method further includes providing a voltage to a second terminal of the fourth driving transistor and in response to detecting that a voltage of the BL is increased to a second release voltage, increasing the voltage of the second terminal of the fourth driving transistor.

In some implementations, memory cells coupled to the first WL are to be erased during a selective erase operation after the time period, and the first WL and the second WL are associated with two consecutive index numbers. The two consecutive index numbers are natural numbers.

In some implementations, the first WL drives memory cells to be erased during an erase operation, and the second WL is a dummy WL adjacent to the first WL.

According to another aspect of the present disclosure, a memory device is provided. The memory device includes a memory block comprising a BSG, a SL, a first WL, a second WL, and a memory string comprising a channel coupled to the SL. The memory device further includes a peripheral circuit comprising a voltage generator, a string driver coupled to the BSG, the first WL, and the second WL. The peripheral circuit is configured to increase a voltage of the SL from an initial voltage at a beginning of a time period, where the voltage of the SL is increased to an erase voltage at an end of the time period; apply a first voltage to the first WL through the string driver before the end of the time period; apply a second voltage to the second WL through the string driver before the end of the time period; and apply a third voltage to the second WL through the string driver no later than the end of the time period, where the third voltage is higher than the second voltage.

In some implementations, the peripheral circuit is further configured to increase a voltage of a gate of the BSG to an offset voltage to float the BSG in response to detecting that the voltage of the SL is increased to a release voltage during the time period.

In some implementations, a first driving transistor of the string driver is coupled to the BSG, a second driving transistor of the string driver is coupled to the first WL, a third driving transistor of the string driver is coupled to the second WL, gates of the first driving transistor, the second driving transistor, and the third driving transistor are coupled together. The voltage generator is further configured to: apply a string driver gate voltage to the gate of the first driving transistor; increase the string driver gate voltage from a supply voltage to a first string driver voltage after the beginning of the time period; and increase the string driver gate voltage from the first string driver voltage to a second string driver voltage no later than the end of the time period.

In some implementations, the first voltage is provided to a second terminal of the second driving transistor, and the second voltage is provided to a second terminal of the third driving transistor.

In some implementations, the second string driver voltage is less than an addition of a threshold voltage of the first driving transistor and a floating voltage of the BSG.

In some implementations, after the first transistor is floated, a floating voltage of the BSG increases as the voltage of the SL increases.

In some implementations, the memory block further comprises a BL and a TSG, the BL is coupled to the SL through a switch, and the TSG is coupled to a first terminal of a fourth driving transistor of the string driver. The voltage generator is further configured to: provide a voltage to a second terminal of the fourth driving transistor; and in response to detecting that a voltage of the BL is increased to a second release voltage, increase the voltage of the second terminal of the fourth driving transistor.

In some implementations, the first WL and the second WL are associated with two consecutive index numbers, the two consecutive index numbers are natural numbers, and memory cells driven by the first WL are to be erased during a selective erase operation after the time period.

In some implementations, the first WL drives memory cells to be erased during an erase operation, and the second WL is a dummy WL adjacent to the first WL.

According to another aspect of the present disclosure, a memory system is provided. The memory system includes a memory device and a memory controller. The memory controller is configured to control the memory device. The memory device includes a memory block comprising a BSG, a SL, a first WL, a second WL, and a memory string including a channel coupled to the SL. The memory device further includes a peripheral circuit including a voltage generator, a string driver coupled to the BSG, the first WL, and the second WL. The peripheral circuit is configured to: increase a voltage of the SL from an initial voltage at a beginning of a time period, where the voltage of the SL is increased to an erase voltage at an end of the time period; apply a first voltage to the first WL through the string driver before the end of the time period; apply a second voltage to the second WL through the string driver before the end of the time period; and apply a third voltage to the second WL through the string driver no later than the end of the time period, where the third voltage is higher than the second voltage.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described example implementations, but should be defined only in accordance with the following claims and their equivalents. Accordingly, other implementations also are within the scope of the claims.

What is claimed is:

1. A method for operating a memory device, the method comprising:
  increasing a voltage of a source line (SL) coupled to a memory string from an initial voltage at a beginning of a time period, wherein the voltage of the SL is increased to an erase voltage at an end of the time period;
  applying a first voltage to a first word line (WL) before the end of the time period;
  applying a second voltage to a second WL adjacent to the first WL before the end of the time period;
  applying a third voltage to the second WL after applying the second voltage to the second WL but no later than the end of the time period, wherein the third voltage is higher than the second voltage; and
  in response to detecting that the voltage of the SL is increased to a release voltage during the time period, increasing a voltage of a gate of a first transistor comprised in the memory string to an offset voltage, the release voltage being smaller than the erase voltage,
  wherein memory cells coupled to the first WL are to be erased during an erase operation after the time period.

2. The method of claim 1, wherein the first transistor is a bottom select gate (BSG) of the memory string, the BSG is coupled to a first terminal of a first driving transistor of a string driver, the first WL is coupled to a first terminal of a second driving transistor of the string driver, and the second WL is coupled to a first terminal of a third driving transistor of the string driver, and wherein the method further comprises:
  applying a string driver gate voltage to a gate of the first driving transistor, a gate of the second driving transistor, and a gate of the third driving transistor;
  increasing the string driver gate voltage from a supply voltage to a first string driver voltage before the end of the time period; and
  increasing the string driver gate voltage from the first string driver voltage to a second string driver voltage no later than the end of the time period.

3. The method of claim 1, wherein the offset voltage is determined based on subtracting a threshold voltage of the first transistor from the first string driver voltage.

4. The method of claim 2, wherein:
  providing a first voltage to the first WL comprises providing the first voltage to a second terminal of the second driving transistor; and
  providing a second voltage to the second WL comprises providing the second voltage to a second terminal of the third driving transistor.

5. The method of claim 2, wherein the second string driver voltage is less than a sum of a threshold voltage of the BSG driver and a floating voltage of the BSG.

6. The method of claim 5, wherein after the first transistor is floated, the floating voltage of the BSG increases as the voltage of the SL increases.

7. The method of claim 6, wherein the memory string further comprises a top select gate (TSG) coupled to a bit line (BL), the BL is coupled to the SL through a switch, and the TSG is coupled to a first terminal of a fourth driving transistor of the string driver, and wherein the method further comprises:
  providing a voltage to a second terminal of the fourth driving transistor; and in response to detecting that a voltage of the BL is increased to a second release voltage, increasing the voltage of the second terminal of the fourth driving transistor.

8. The method of claim 1, wherein the first WL and the second WL are associated with two consecutive index numbers, wherein the two consecutive index numbers are natural numbers.

9. The method of claim 1, wherein the second WL is a dummy WL adjacent to the first WL.

10. A memory device comprising:

a memory block comprising a bottom select gate (BSG), a source line (SL), a first word line (WL), a second WL, and a memory string comprising a channel coupled to the SL; and a peripheral circuit comprising a voltage generator, a string driver coupled to the BSG, the first WL, and the second WL, wherein the peripheral circuit is configured to:

increase a voltage of the SL from an initial voltage at a beginning of a time period, wherein the voltage of the SL is increased to an erase voltage at an end of the time period;

apply a first voltage to the first WL through the string driver before the end of the time period;

apply a second voltage to the second WL through the string driver before the end of the time period; and apply a third voltage to the second WL through the string driver after applying the second voltage to the second WL but no later than the end of the time period, wherein the third voltage is higher than the second voltage, wherein the peripheral circuit is further configured to:

increase a voltage of a gate of the BSG to an offset voltage to float the BSG in response to detecting that the voltage of the SL is increased to a release voltage during the time period, the release voltage being smaller than the erase voltage, wherein memory cells coupled to the first WL are to be erased during an erase operation after the time period.

11. The memory device of claim 10, wherein a first driving transistor of the string driver is coupled to the BSG, a second driving transistor of the string driver is coupled to the first WL, a third driving transistor of the string driver is coupled to the second WL, gates of the first driving transistor, the second driving transistor, and the third driving transistor are coupled together, and wherein the voltage generator is further configured to:

apply a string driver gate voltage to the gate of the first driving transistor;

increase the string driver gate voltage from a supply voltage to a first string driver voltage after the beginning of the time period; and increase the string driver gate voltage from the first string driver voltage to a second string driver voltage no later than the end of the time period.

12. The memory device of claim 11, wherein the first voltage is provided to a second terminal of the second driving transistor, and the second voltage is provided to a second terminal of the third driving transistor.

13. The memory device of claim 12, wherein the second string driver voltage is less than an addition of a threshold voltage of the first driving transistor and a floating voltage of the BSG.

14. The memory device of claim 11, wherein after the first transistor is floated, a floating voltage of the BSG increases as the voltage of the SL increases.

15. The memory device of claim 14, wherein the memory block further comprises a bit line (BL) and a top select gate (TSG), the BL is coupled to the SL through a switch, and the TSG is coupled to a first terminal of a fourth driving transistor of the string driver, and wherein the voltage generator is further configured to:

provide a voltage to a second terminal of the fourth driving transistor; and in response to detecting that a voltage of the BL is increased to a second release voltage, increase the voltage of the second terminal of the fourth driving transistor.

16. The memory device of claim 10, wherein the first WL and the second WL are associated with two consecutive index numbers, wherein the two consecutive index numbers are natural numbers, and memory cells driven by the first WL are to be erased during a selective erase operation after the time period.

17. The memory device of claim 10, wherein the second WL is a dummy WL adjacent to the first WL.

18. A memory system comprising a memory device and a memory controller, wherein:

the memory controller is configured to control the memory device; and the memory device comprises:

a memory block comprising a bottom select gate (BSG), a source line (SL), a first word line (WL), a second WL, and a memory string comprising a channel coupled to the SL, and a peripheral circuit comprising a voltage generator, a string driver coupled to the BSG, the first WL, and the second WL, wherein the peripheral circuit is configured to:

increase a voltage of the SL from an initial voltage at a beginning of a time period, wherein the voltage of the SL is increased to an erase voltage at an end of the time period;

apply a first voltage to the first WL through the string driver before the end of the time period;

apply a second voltage to the second WL through the string driver before the end of the time period; and apply a third voltage to the second WL through the string driver after applying the second voltage to the second WL but no later than the end of the time period, wherein the third voltage is higher than the second voltage, wherein the peripheral circuit is further configured to:

increase a voltage of a gate of the BSG to an offset voltage to float the BSG in response to detecting that the voltage of the SL is increased to a release voltage during the time period, the release voltage being smaller than the erase voltage, and wherein memory cells coupled to the first WL are to be erased during an erase operation after the time period.

19. The memory system of claim 18, wherein a first driving transistor of the string driver is coupled to the BSG, a second driving transistor of the string driver is coupled to the first WL, a third driving transistor of the string driver is coupled to the second WL, gates of the first driving transistor, the second driving transistor, and the third driving transistor are coupled together, and wherein the voltage generator is further configured to:

apply a string driver gate voltage to the gate of the first driving transistor;

increase the string driver gate voltage from a supply voltage to a first string driver voltage after the beginning of the time period; and increase the string driver gate voltage from the first string driver voltage to a second string driver voltage no later than the end of the time period.

20. The memory system of claim 19, wherein the first voltage is provided to a second terminal of the second driving transistor, and the second voltage is provided to a second terminal of the third driving transistor, and wherein the second string driver voltage is less than an addition of a threshold voltage of the first driving transistor and a floating voltage of the BSG.

\* \* \* \* \*